US006052748A

United States Patent [19]

Suominen et al.

[11] Patent Number: 6,052,748

[45] Date of Patent: Apr. 18, 2000

[54] ANALOG RECONSTRUCTION OF ASYNCHRONOUSLY SAMPLED SIGNALS FROM A DIGITAL SIGNAL PROCESSOR

[75] Inventors: Edwin A. Suominen, P.O. Box 14437 N. 39th Way, Phoenix, Ariz. 85032; Robert Roth, Mill Creek, Wash.

[73] Assignee: Edwin A. Suominen

[21] Appl. No.: 09/039,857

[22] Filed: Mar. 16, 1998

Related U.S. Application Data

[60] Provisional application No. 60/040,519, Mar. 18, 1997.

[51] Int. Cl.[7] .......... G06F 13/14; G01R 31/377

[52] U.S. Cl. .......... 710/57; 375/372; 713/503; 714/39

[58] Field of Search .......... 364/178, 179; 375/224, 226, 228, 371, 372; 710/57; 713/501, 503; 714/39, 45, 724

[56] References Cited

U.S. PATENT DOCUMENTS

| | | | |
|---|---|---|---|
| 3,671,776 | 6/1972 | Houston | 327/155 |
| 3,742,145 | 6/1973 | Clark et al. | 370/505 |
| 3,754,098 | 8/1973 | Abramson et al. | 375/371 |
| 4,057,768 | 11/1977 | Juliusburger et al. | 331/1 A |
| 4,210,776 | 7/1980 | VanMeter | 375/376 |
| 4,270,183 | 5/1981 | Robinson et al. | 710/57 |
| 4,585,975 | 4/1986 | Wimmer | 315/307 |
| 4,596,026 | 6/1986 | Cease et al. | 375/372 |
| 4,821,269 | 4/1989 | Jackson et al. | 714/724 |
| 4,972,138 | 11/1990 | Bush | 324/73.1 |
| 5,101,369 | 3/1992 | Torii et al. | 708/314 |
| 5,109,394 | 4/1992 | Hjerpe et al. . | |
| 5,142,679 | 8/1992 | Owaki et al. | 395/704 |
| 5,173,617 | 12/1992 | Alsup et al. | 82/142 |
| 5,243,344 | 9/1993 | Koulopoulos et al. | 341/143 |
| 5,245,667 | 9/1993 | Lew | 381/94.4 |
| 5,263,143 | 11/1993 | Robinson et al. | 711/100 |
| 5,323,426 | 6/1994 | James et al. | 375/372 |
| 5,329,556 | 7/1994 | Meitner et al. | 375/354 |
| 5,375,228 | 12/1994 | Leary et al. | 714/33 |
| 5,381,116 | 1/1995 | Nuckolls et al. | 331/1 A |
| 5,463,337 | 10/1995 | Leonowich | 327/158 |
| 5,497,152 | 3/1996 | Wilson et al. . | |
| 5,499,274 | 3/1996 | Brown . | |
| 5,512,895 | 4/1996 | Madden et al. . | |
| 5,512,897 | 4/1996 | Wilson et al. . | |
| 5,550,877 | 8/1996 | Waters . | |
| 5,581,695 | 12/1996 | Knoke et al. | 714/28 |
| 5,602,882 | 2/1997 | Co et al. | 375/372 |
| 5,634,022 | 5/1997 | Crouse et al. . | |
| 5,668,817 | 9/1997 | Adham | 714/732 |
| 5,748,878 | 5/1998 | Rees et al. | 714/38 |

OTHER PUBLICATIONS

Edmund Sim, Debugging for DSP–Based Wireless Applications, Wireless Systems Design, Feb. 1997, pp. 52,54.

Logic Analyzers: PM 3580 Family, 1994 Fluke Catalog, 1994, pp. 273–277.

CS61600 PCM Jitter Attenuator Data Sheet, Crystal Semiconductor Data Book DS9F3, Apr. 1990, pp. 4.3–4.14.

*Primary Examiner*—Thomas C. Lee
*Assistant Examiner*—Albert Wang
*Attorney, Agent, or Firm*—Edwin A. Suominen

[57] ABSTRACT

A sample reconstruction device and method extracts digital values from a DSP that are digital samples of a signal of interest and reconstructs the digital samples into an equivalent analog signal. A context detector monitors the context of the DSP's operation and determines when a digital value being processed by the DSP is a digital sample of a signal of interest. The context detector may be implemented using a logic analyzer, DSP emulator system, or the DSP itself. A digital probe or input extracts the digital values selected by the context detector for reconstruction into an analog signal. A sample buffering system having a FIFO buffer memory and control loop is employed to ensure that the analog sample interval is substantially constant, even if there is a great deal of variation between the digital sample intervals. The analog samples are reconstructed into an analog signal that accurately represents the digital signal found within the DSP. This signal may then be sent to specialized test equipment suited for analysis of analog signals.

29 Claims, 10 Drawing Sheets

ANALOG RECONSTRUCTION OF ASYNCHRONOUSLY SAMPLED SIGNALS FROM A DIGITAL SIGNAL PROCESSOR

This application claims benefit of U.S. Provisional Application Ser. No. 60/040,519, filed Mar. 18, 1997.

FIELD OF THE INVENTION

This invention relates to diagnostic systems for digital systems that process digital sampled signals. More particularly, this invention relates to the accurate reconstruction of an analog signal from digital samples produced by a digital signal processor or digital signal processing system under development or test.

BACKGROUND OF THE INVENTION

The signals generated by the modern digital signal processor (DSP) have become increasingly complex and difficult to analyze. For proper development and testing of the sophisticated algorithms processing these signals, the DSP or the system using the DSP should be analyzed in real-time operation. In many cases, it would be desirable to analyze the intermediate signals represented by digital samples that are normally found only within the DSP or DSP system. The term "DSP" will hereinafter be understood to include both a digital signal processor under development or test as well as a system under development or test that performs digital signal processing.

Some logic analyzers and DSP development systems allow some analysis of such signals, but this analysis is limited in real-time performance and flexibility. Some logic analyzers, for example, may produce plots of the amplitude levels represented by a series of digital samples produced within a DSP, but the plot merely gives a graphical display of the signal. The signals produced by many algorithms are often difficult to interpret with a simple waveform plot. In other DSP diagnostic systems, a selected group of digital samples may be plotted graphically on a host computer. No real-time signals are produced in such systems, and the flexibility of this kind of analysis is limited to the functions available in the software.

The Applicants have perceived that greatly improved analysis of the algorithms used in modern signal processing could be obtained if truly real-time signals could be reconstructed that are suitable for specialized test equipment, including the oscilloscope, spectrum analyzer, modulation analyzer, as well as devices that interface to the signal processing system under development or test. In many cases, the human ear is also a useful analysis tool for signal processing. None of this equipment, including the ear, is suitable for analyzing signals that only exist within the DSP because an actual signal is required rather than just a collection of numbers. The relationship of amplitude level and time is critical to the analysis performed by this equipment; mere numbers representing samples mean nothing to it.

Diagnostic systems for reconstructing digital samples from a DSP into analog signals are known that depend on prior knowledge of the sample timing. Such systems are not suitable for reconstructing signals from points within a system where the sample timing is not known. In many cases, it is not possible or convenient to provide such prior knowledge to a diagnostic system.

Such known diagnostic systems are also unsuitable for reconstructing digital samples that are processed at varying intervals. Such processing is becoming more commonplace as DSPs begin to use more complex software structures having multiple threads of microprocessor execution. The servicing of interrupts and high-level coding of the signal processing functions often causes the processing of the digital samples to lose any real-time relationship to the actual signal they represent. Another problem is that some signal processing algorithms, such as the square root function, can take a varying amount of time to execute, and this execution time can depend on the input signal. The digital samples representing the results of such algorithms would be reconstructed at varying times, resulting in an analog signal with jitter that may be dependent on the signal itself. This jitter would be compounded if the result were derived from several time-varying algorithms.

The signal reconstruction of known diagnostic systems encounters even more difficulty with burst-mode samples. Digital signal processing is often performed on bursts of signals in the interest of efficiency. In addition, many signals are time-division multiplexed such as in the GSM cellular telephone standard. Algorithms processing such burst-mode signals produce several samples within a relatively narrow time interval. In order to reconstruct the results of this processing, several samples must often be extracted in a burst in which the interval between samples is no more than a few DSP clock cycles. The interval between these bursts will typically be much longer, and the resulting variation in sample intervals causes the digital samples to lose their real-time relationship to the signal they represent.

The Applicants have found that sample timing is a fundamental problem with the reconstruction of digital signals from a DSP. The digital samples appear at intervals which are not known and which vary widely from one sample to the next. Analog samples must be produced at relatively constant intervals for accurate reconstruction. The true rate at which the digital samples are produced must be preserved, so that the analog signal accurately reconstructs the real-time signal, which the digital samples represent.

The Applicants have discovered that a solution to this problem is to buffer the samples from the DSP and generate buffered samples at the same mean rate but at relatively constant intervals. Sample buffering systems are known to those skilled in the communications art. U.S. Pat. No. 3,754,098, for example, contains a disclosure of a communications system using sample buffering. At the receiving end of a digital communications link, samples intended for the receiving station are extracted from the communications link and sent to a sample buffering system that uses a buffer memory and an analog control loop. The number of samples stored in the buffer memory is converted to an analog error signal, filtered, and applied to an analog voltage controlled oscillator (VCO). The digital samples are clocked out of the buffer memory at a rate determined by the VCO. They are then converted to analog voltage levels with a D/A converter. The extraction is tied directly to the encoding of the original analog signal into the digital samples that are to be extracted.

As has already been mentioned above, the digital samples produced by modern signal processing quickly lose their real-time relationship to the original analog signal or signals from which they were derived. Such samples cannot be extracted from a DSP based simply on the timing of the sampling of the original analog signal or signals. Rather, the Applicants have found that the extraction of such samples should be triggered by the context of the operations of the DSP that produces them. Such a triggering event might be the execution of a special test instruction, the assertion of a particular address or range of addresses on the address bus of the DSP, or the assertion of an I/O pin by the DSP.

Sample buffering systems are also known in the communications art that use digital circuitry for the control loop. Such systems are intended for the narrowband frequency range required of a communications application. One known system, for example, uses a buffer memory and an unfiltered digital control loop to set the output sample rate according to the difference between input and output addresses. The frequency characteristics of a digital loop filter would be degraded by the jittering transferred from the input signal to the loop filter update rate. No loop filter is used, perhaps because the control loop is updated at a rate determined by the input samples. The unfiltered control loop will respond to aliases of frequencies beyond the limited range utilized in a communication system. Thus this known system is suitable for a narrow range of frequencies.

SUMMARY OF THE INVENTION

A device and method according to various aspects of the invention extracts only those digital values from a DSP that are indicated to be samples of a signal of interest by the context of the DSP's operation, and then reconstructs the digital samples into a series of uniformly spaced analog samples which accurately reproduce the equivalent analog signal.

The spacing of the analog samples is substantially constant even when there is considerable variation in the time intervals between the digital samples extracted from the DSP.

Reconstructed signals are provided that may be analyzed by a wide variety of specialized test equipment, including the oscilloscope, spectrum analyzer, modulation analyzer, and other components of the signal processing system under development or test, as well as the human ear.

According to the teachings of the invention, a context detector monitors the context of the DSP's operation. The context detector generates a trigger signal when the context indicates that a present digital value being processed by the DSP is a digital sample of a signal of interest. The context of the DSP's operation may be determined by the DSP itself with the inclusion of a special test instruction that indicates the presence of such a sample. This instruction may cause the DSP to assert the trigger signal on one of its I/O pins after it produces a sample of interest. Alternatively, the instruction may write the sample into a special register that sends the trigger signal and the sample outside the DSP. The context of the DSP's operation may also be determined by a logic analyzer or emulator system monitoring the DSP which can detect that the DSP software has caused a memory access known to produce a sample of interest.

When the trigger signal is asserted, a digital probe or input extracts the present digital value being processed by the DSP for reconstruction into an analog signal. This operation may occur without affecting the function of the DSP. It may also be done as part of a special test instruction. The probe or input receives the digital value from the DSP through a data bus, I/O port, or serial port.

The digital value extracted from the DSP is written to a FIFO buffer memory. The writing of this sample value increments a sample error counter. When a sample is read from the FIFO buffer memory, this sample error counter is decremented. Accordingly, the number of samples stored in the FIFO buffer memory corresponds to an error value. This error value is then fed to a control loop which sets the rate at which samples are read from the FIFO buffer memory.

The control loop and the FIFO buffer memory form a sample buffering system which sets the interval between output samples from the FIFO buffer memory to be equivalent to the mean interval between input samples. The sample buffering system also ensures that the output sample interval is substantially constant, even if there is a great deal of variation between the input sample intervals.

The output samples read from the FIFO buffer memory are reconstructed into an analog signal which accurately represents the digital signal found within the DSP. This analog signal may then be sent to specialized test equipment suited for analysis of analog signals, including the human ear.

DETAILED DESCRIPTION OF THE INVENTION

Figure 1:
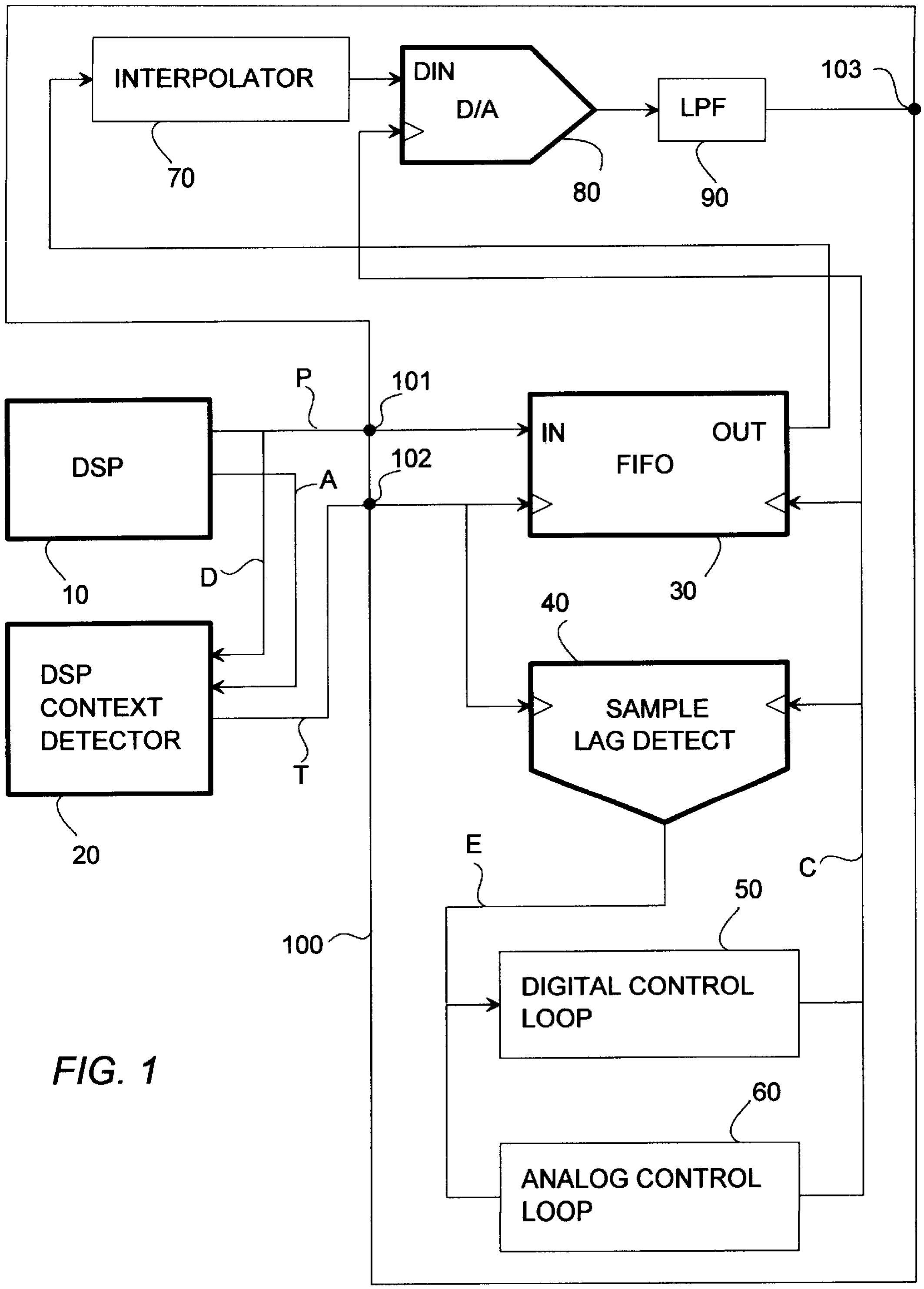
FIG. 1 is a block diagram showing a configuration of the present invention.

As may be better understood with reference to FIG. 1, a sample reconstruction circuit 100 according to various aspects of the present invention includes a DSP 10 and a context detector 20 for detecting the context of the DSP's operation. DSP 10 may be either a digital signal processor or a system that performs digital signal processing. DSP 10 produces a digital sample representing a signal of interest each time it accesses a particular memory address or range of addresses. The particular memory address may be the location of an instruction that causes the DSP to produce the digital sample, or it may be a memory location in which the digital sample is stored. In some cases, DSP 10 may produce a new digital sample of interest whenever it accesses an address within a particular range of addresses.

Context detector 20 generates a trigger signal T when the context of the DSP's operation indicates that a new digital sample of interest has been produced. The context detector may be implemented in several different configurations. In the simplest configuration, the DSP is programmed to indicate that a new digital sample of interest is present by the inclusion of a special test instruction asserting one of its I/O pins. In this case, DSP 10 indicates the context of its activity by itself and thus perform the function of context detector 20.

Context detector 20 may also implemented with a small amount of additional circuitry on the integrated circuit containing the DSP. The DSP may use this circuitry with a special test instruction to send a copy of a digital sample of interest outside the DSP. When the DSP has generated a digital sample of interest, it executes the special test instruction to send a copy of the sample to a dedicated register. The register then sends the digital sample outside the DSP to sample reconstruction circuit 100. Referring to FIG. 1 for this configuration, trigger signal T is encoded onto the signal leaving the DSP by the context detecting circuitry on the DSP integrated circuit. This configuration will be described in greater detail with respect to FIGS. 9 and 10.

In another configuration, a logic analyzer is connected to the address bus and possibly the read/write strobe of DSP 10. The external trigger signal from the logic analyzer is then used as trigger signal T. An embodiment of the present invention using a logic analyzer will be described in greater detail below with respect to FIG. 4.

In still another implementation of context detector 20, an emulator system generates trigger signal T when it detects that the DSP software has caused a memory access known to produce a sample of interest. Suitable emulator systems are available which incorporate DSP 10 or monitor its activity indirectly with boundary scanning. An embodiment of the present invention using an emulator will be described in greater detail with respect to FIG. 5.

In a variation, signal reconstructing circuit 100 monitors trigger signal T on an input port 102. When context detector 20 asserts trigger signal T in the manner described above, circuit 100 extracts the digital value present on a digital bus or port P being monitored of DSP 10 with a digital probe 101. Sample reconstruction circuit 100 may be comprised of functions inside a digital signal processor or dedicated circuitry, or a combination of both.

Figure 9:
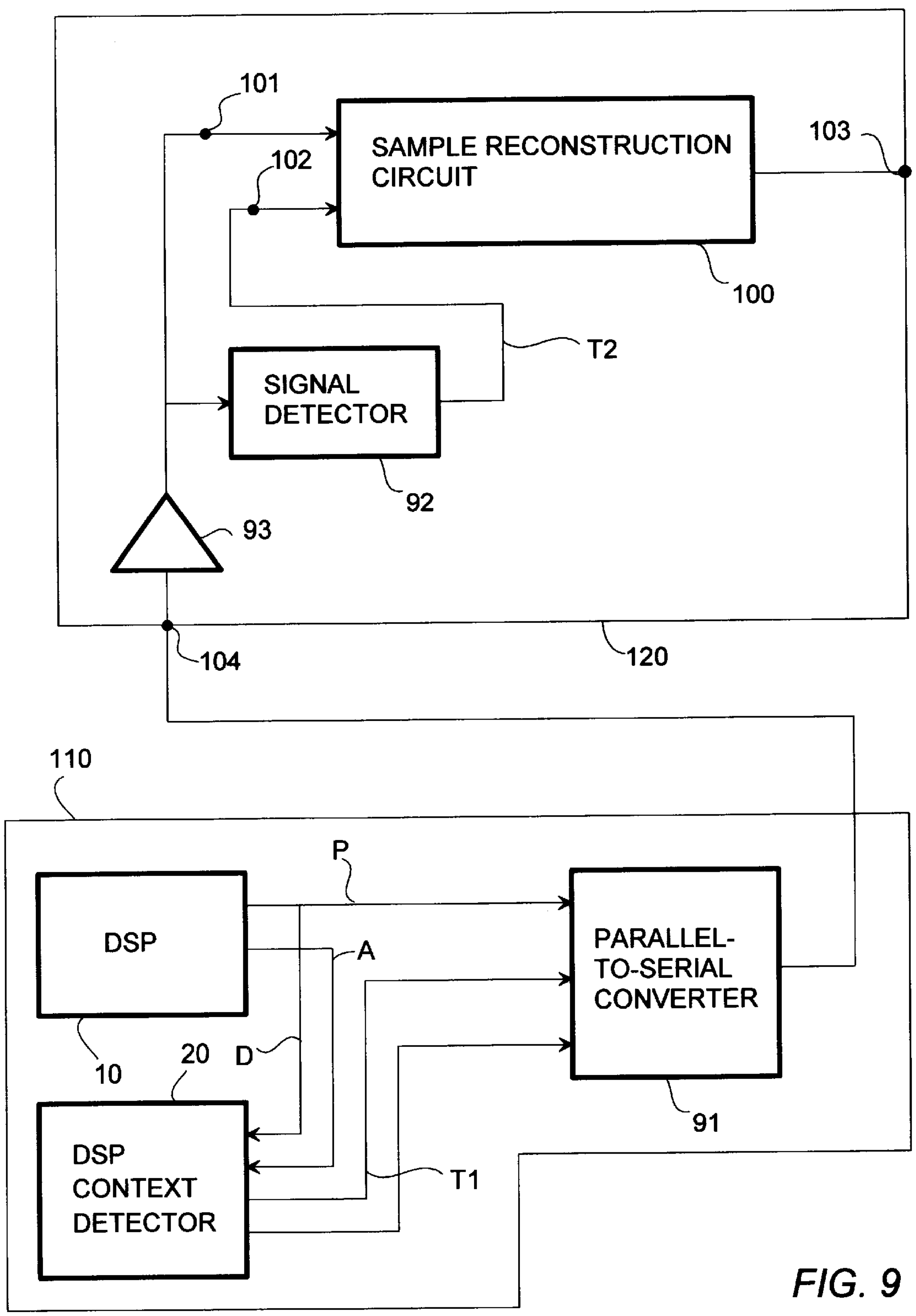
FIG. 9 is a block diagram showing a configuration of the present invention wherein the DSP context detector is on the same integrated circuit containing the DSP.

In such a variation, digital probe 101 makes an electrical connection to several or all of the bits on bus or port P. As shown in FIG. 9, probe 101 may also be responsive to serial data. A suitable probe is of the type commonly used with a logic analyzer to monitor several pins of an integrated circuit without disrupting any of the existing connections. Digital probe 101 may also provide data signals to an optional logic analyzer acting as context detector 20 during the operation of the present invention, with electrical splitting of the signals from the shared probe. Digital probe 101 may also obtain its input from an emulator using either parallel or serial format. Probe 101 may also connect to a special test port on the DSP. These alternative arrangements will be described in greater detail with respect to FIGS. 4, 5, 9 and 10.

When trigger input 102 is asserted, the new sample extracted from DSP 10 is clocked into a FIFO buffer memory 30. FIFO 30 may be implemented, for example, in a dedicated FIFO memory IC, or as a circular buffer within a digital signal processor.

Figure 2:
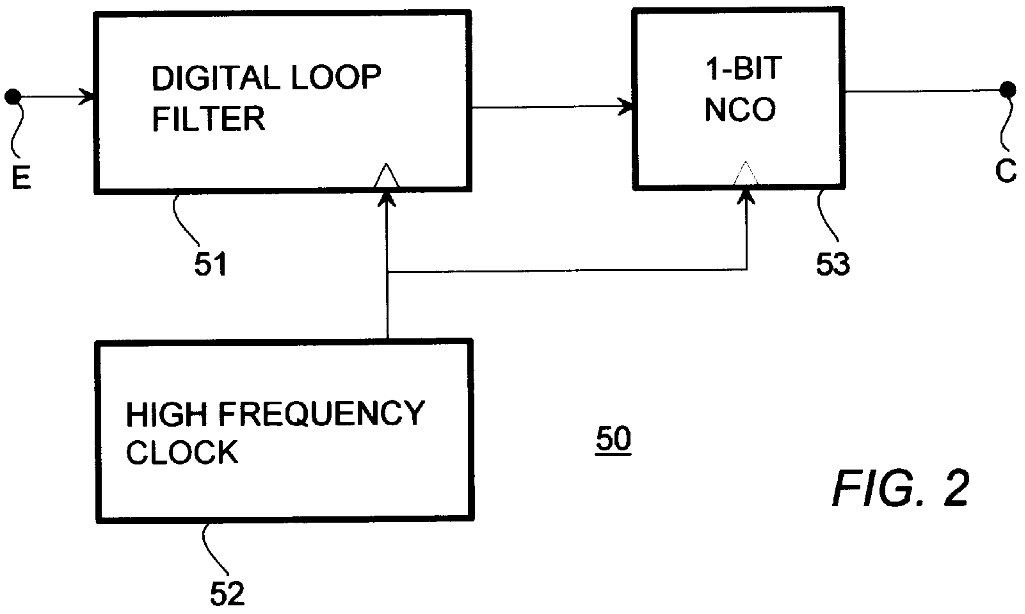
FIG. 2 is a block diagram showing a preferred embodiment of a digital control loop for use in an embodiment of the present invention.

The assertion of trigger input 102 also increments a sample lag detector 40. This increases an error term E on the output of sample lag detector 40 by one integer step. The increased error term E indicates to either a digital control loop 50 or an analog control loop 60 that the output sample is now one more samples behind the input. The particular implementation of the analog and digital control loops will be described in more detail with respect to FIGS. 2 and 3.

Either analog control loop 50 or digital control loop 60, depending on the particular embodiment of the present invention, generates an output sample clock C. The clock pulses occur at substantially constant intervals which are determined by error term E. Output sample clock C causes samples to be read from FIFO buffer memory 30 and decrements sample lag detector 40. This decreases error term E on the output of sample lag detector 40 by one integer step. The decreased error term E indicates to either digital control loop 50 or analog control loop 60 that the output sample is now one less sample behind the input.

The digital output samples are sent to a D/A converter 80, which is clocked by sample clock C at substantially constant intervals. D/A converter 80 reconstructs the digital output samples into an accurate reproduction of the analog signal they represent. The analog signal is then applied to an output 103, from which it may be sent to external test equipment.

The output samples may be sent to an optional interpolator 70 before they are reconstructed by D/A converter 80 to increase the sample rate of the reconstructed output signal. An interpolator oversamples a digital signal with lowpass digital filtering to reduce the aliases of the signal produced by its input (lower) sample rate. These aliases can be filtered out by digital filtering at the output (higher) sample rate when performed with digital filtering. This function is well known by those skilled in the digital signal processing art.

Interpolator 70, if used, reduces the aliasing of signals with low sample rates by separating the aliases from the actual spectral content of the signal. A lowpass filter 90 may also be used to attenuate the aliases of signals having higher sample rates. If interpolator 70 and lowpass filter 90 are used together, aliases from a wide range of sample rates may be attenuated from the spectrum of the reconstructed signal. For example, a smooth waveform with limited aliasing distortion may be desired over a range of sample rates spanning a full decade (10:1 ratio). In this case, an oversampling rate of 6 times the output sample rate would be desirable. The 6× oversampling would push the closest alias of a signal having the lowest rate within this range just beyond the Nyquist frequency of a signal having the highest sample rate within this range.

The oversampling rate may be altered depending on the sample rate of the signal. A signal with a higher sample rate requires less oversampling because its aliases are spaced farther apart, and less aliases need to be removed before the cutoff frequency of lowpass filter 90. Interpolation of a signal having a higher sample requires more DSP resources, so reducing the oversampling ratio of such a signal tends to equalize the DSP requirements of interpolation for all sample rates. For the 10:1 frequency span in the example above, it is convenient to define three desirable oversampling rates, which are given in the following table:

| Unit Sample Rate | Oversampling Rate |
|---|---|
| 1–2 | 6x |
| 2–3 | 3x |
| 3–10 | 2x |

Some hysteresis will of course be desirable in the selection of oversampling rates from this table to prevent excessive switching between oversampling rates at frequencies near the end of a particular range.

It will be recognized by one skilled in the art that neither the oversampling of interpolator 70 nor the anti-aliasing of lowpass filter 90 are required in all cases to realize the benefits of the present invention. It may be desirable to have provision for enabling or disabling interpolator 70 and lowpass filter 90 according to a specific application. One of skill in the digital signal processing art will recognize the type of oversampling, if any, to use in appropriate applications of the present invention and will understand how to implement it according to conventional teachings. Such teachings are found in the classic text *Multirate Digital Signal Processing* by Crochiere and Rabiner (Prentice-Hall 1983), incorporated herein by reference.

The output sample rate is determined by either digital control loop 50 or analog control loop 60, the input to which is error term E. The structure of digital control loop 50 will be described first, with respect to FIG. 2.

Error term E is applied to the input of a digital loop filter 51 which updates at a rate determined by a high frequency clock 52. If digital control loop 50 is implemented in a digital signal processor, clock 52 is divided down in filter 51 to process samples at a relatively small fraction of the frequency of clock 52. If loop 50 is implemented in an ASIC or programmable logic device, filter 51 may process samples at a rate equal to or near the frequency of clock 52.

Filter 51 is designed to have a lowpass response with a low cutoff frequency. It is desirable for the output sample rate to have a substantially constant interval, even when error term E has substantial variance from the extraction of samples in bursts. Accordingly, the cutoff frequency of filter 51 should be made considerably lower than the rate at which bursts of samples are to be extracted.

A cutoff frequency (fc) of 0.0001 times the sample processing rate (fs) has been found desirable. An even lower cutoff frequency would be better for some applications if practical to implement. To realize such a low cutoff frequency, an IIR lowpass filter should be used with special consideration given to the effects of finite-precision arithmetic. A single-pole Butterworth lowpass filter has been made to work with fc=0.0001*fs using 16-bit arithmetic. The cutoff frequency of filter 51 seems to have an effect on the overall behavior of the control loop, as will be discussed in more detail below with respect to FIGS. 6 through 8.

Assembly language instructions for one exemplary implementation of digital loop filter 51 in a 21xx family digital signal processor are given in Table I below. The 21xx family of digital signal processors is manufactured by Analog Devices Inc. The input to this code module is error term E, which is assumed to be in the data memory location labeled "error." Error term E is converted from a fixed-point integer into a floating-point number. This allows a wide range of values to be integrated into loop filter 51, implemented here as a first-order lowpass filter. The output of this code module is in register "mr1" of the digital signal processor.

The output of digital loop filter 51 is a digital signal whose value is proportional to the time-averaged sample lag between input and output samples stored in FIFO 30, as determined by sample lag detector 40. Numerically controlled oscillator (NCO) 53 generates sample clock C at a rate controlled by this output signal. One of skill in the digital signal processing art will recognize many ways in which NCO 53 may easily be implemented.

Assembly language instructions for one exemplary implementation of NCO 53 in a 21xx family digital signal processor are given in Table II below. The input to this code module is the scaled output of digital loop filter 51, which is assumed to be in register "mr1" of the digital signal processor. The unscaled reciprocal of this scaled digital value is computed to yield a time interval between output samples. In code not shown in Table II, this time interval is loaded into the timer of the digital signal processor. The timer is thus programmed to generate a periodic interrupt at a rate proportional to the output of filter 51. In servicing this interrupt, the digital signal processor generates sample clock C.

If FIFO 30 is implemented in the same digital signal processor implementing digital control loop 50, the interrupt service routine will also read an output sample from a circular buffer and send it to either interpolator 70 or D/A converter 80. Interpolator 70 may also be implemented in this same digital signal processor.

While the implementation of NCO 53 given in Table II and described above is simple and in many cases adequate, the output sample rate is quantized somewhat from a loss of numerical precision in the computation of the reciprocal. Accordingly, it may be preferable to implement NCO 53 in a more conventional fashion using a phase accumulator. In this case, the output of filter 51 is added to an accumulator with each update of digital control loop 50, and output sample clock C is asserted whenever the binary number in the accumulator overflows and rolls over. Larger numbers added to the phase accumulator will cause it to roll over more often, and output sample clock C will then have a proportionately higher frequency.

Figure 3:
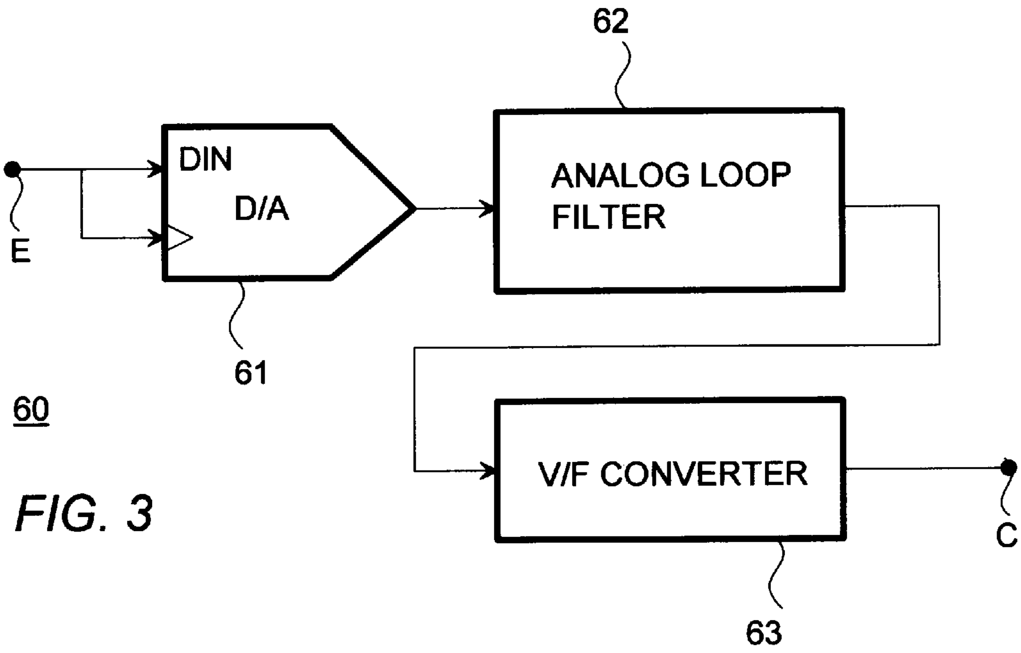
FIG. 3 is a block diagram showing a preferred embodiment of an analog control loop for use in an embodiment of the present invention.

The structure of analog control loop 60 will now be described briefly with respect to FIG. 3. Sample error E is converted into an analog value by a D/A converter 61. The analog sample error is then applied to an analog loop filter 62 which performs the same function and is designed to meet the same specifications as digital loop filter 51. The output of analog loop filter 62 is then applied to a voltage-to-frequency converter 63 which generates output sample clock C at a rate proportional to the voltage present on its input. Voltage-to-frequency converter 63 performs the same function as NCO 53.

It may be preferable to use analog control loop 60 rather than digital control loop 50 if D/A converter 61, analog loop filter 62, and voltage-to-frequency converter 63 cost less than a digital signal processor implementing digital control loop 50. The analog components may also be simpler to implement than the programming required for digital control loop 50. However, a digital signal processor may already be available because it is being used for some other purpose such as implementing FIFO 30 or optional interpolator 70. If this is the case, digital control loop 50 requires no additional hardware and may be preferable over analog control loop 60.

The combination of either digital control loop 50 or analog control loop 60 with FIFO 30 and sample lag detector 40 forms a sample buffering system. The control loop within this system sets the output sample rate according to the sample lag between input and output samples stored in FIFO 30. The output sample rate is preferably a linear function of this sample lag over time. Because input samples may arrive in bursts, the sample lag may have considerable variance. This variance needs to be greatly attenuated so that the interval between output samples is essentially constant.

The loop gain (A) of the control loop is defined as the frequency step added to the output sample rate with one additional sample of error present on sample error E. When sample error E increases by this amount, the frequency of output sample clock C should increase by the value of the loop gain. A desirable value of loop gain has been found to be in the range from A=5000 Hz/sample to A=10,000 Hz/sample. Loop gains beyond this range seem to make the loop unstable and actually increase the settling time of the loop.

The cutoff frequency fc of either digital loop filter 51 or analog loop filter 61 and the loop gain A both determine the behavior of the loop. Although the preferred operating parameters of fc=0.0001×fs and A=5000 Hz/sample provide a good starting point, some variation of these parameters may better configure the control loop to a particular application.

Fortunately, the determination of the appropriate cutoff frequency fc and loop gain A for a particular application is well within the capabilities of one skilled in the design of control-feedback systems. If some minor experimentation is desired to refine these parameters, it may be conveniently done on a prototype using digital control loop 50 by simply adjusting parameters in software. Even if analog control loop 60 is preferred for the particular application, the experimentally refined parameters fc and A may be applied to the design of analog components from the more convenient development with digital control loop 50.

The operation of the control loop within the sample buffering system in sample reconstructing device 100 will now be described by example, with reference to plots generated by computer simulation of an embodiment of the present invention. The operation of this control loop will be described for both a start-up condition, with reference to FIG. 6(*a–d*), and a steady-state condition, with reference to FIG. 7(*a–d*). The computer simulation models bursts of eight input samples occurring close together. The simulation extracts these sample bursts for reconstruction at a mean rate of 1,000,000 samples/sec. This mean input sampling rate is higher than the highest rate encountered in many applications of the present invention. However, it allows easy visualization of the operation of the control loop within the sample buffering system in sample reconstructing device 100.

FIG. 6(*a*) shows a close-up simulation plot of analog levels represented by a burst of digital input samples entering sample reconstruction circuit 100. A plot of two such bursts is shown in FIG. 7(*a*). It can be seen that there is a great difference between the sample interval within the burst and the interval between bursts.

FIG. 6(*b*) shows how the control loop "catches up" to the mean rate of the input samples and begins to send analog output samples at substantially constant intervals. FIG. 7(*b*) shows a simulation plot of the analog output samples after the control loop has entered a steady-state condition. At this point, the interval between output samples is substantially constant. The simulation plots show the reconstructed output signal as it appears without optional interpolator 70 or lowpass filter 90 of FIG. 1.

FIG. 6(*a*) shows that there are eight samples in each burst of input samples. FIG. 7(*a*) shows that two such bursts are received in the time interval occupied by a single period of the reconstructed sine wave shown in FIG. 7(*b*). There are 16 analog samples in each period of the sine wave. Thus it can be seen that the control loop in sample reconstructing device 100 is setting the output sample rate to be substantially equal to the input sample rate while maintaining a substantially constant interval between output samples. This is significant in view of the tremendous difference between the time interval separating input samples within bursts and the time interval separating bursts.

If the sequence of digital input samples shown in FIGS. 6(*a*) and 7(*a*) were reconstructed using the timing of the input samples as shown, the analog signal would of course be unrecognizable. The sequence of reconstructed analog signals shown in FIG. 7 is easily recognized as a sampled sine wave.

FIG. 6(*c*) and FIG. 7(*c*) show the output sample rate for a short time interval during both the start-up and steady-state condition of the control loop's simulated operation. In FIG. 6(*c*), the output sample rate is still "catching up" to the mean input sample rate, and the output sample rate is steadily increasing. In FIG. 7(*c*), the output sample rate in the steady-state condition is shown. Here the output sample rate is no longer changing significantly, but seems to have settled at a point just below the mean input sample rate of 1,000,000 samples/sec.

Figure 8:
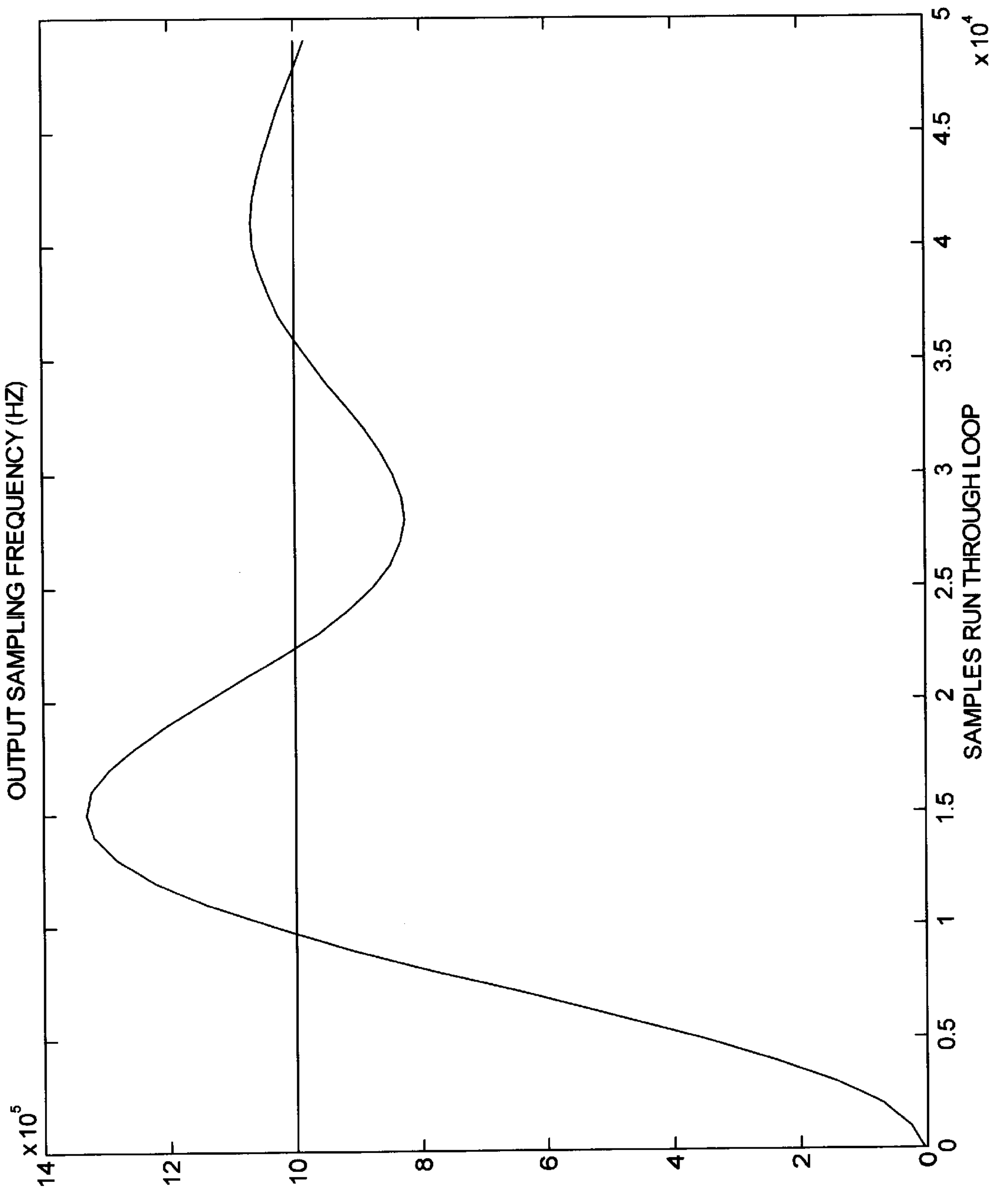
FIG. 8 is a simulation plot that illustrates the settling of a control loop in an embodiment of the present invention from start-up to steady-state operation.

FIG. 8 is a long-term plot of the output sample rate of the simulated control loop. This plot shows that the output sample rate shown in FIG. 7(*c*) is actually near the end of a transition toward the mean input sample rate. The transition to a new sample rate takes no longer than a few seconds. The analysis of a signal at this new sample rate will typically occupy a much longer period. This short transition time does not significantly impact the convenience of the present invention in a development or test application.

Table III shows a printout of the state of the control loop at regular intervals during the simulation described above. The output sample rate, labeled here as "fs2", starts out at zero samples/sec, overshoots the mean input sample rate, then begins to settle to a rate equal to the mean input sample rate. Table III depicts the same time interval shown in FIG. 8.

Sample error E of FIG. 1 is the lag between input and output samples, labeled in Table III as "Sample Error". By the end of the simulation recorded in Table III, the sample error has settled into a range from 91 to 99 samples. The loop gain in this simulation is 10,000 Hz/sample. Thus, a mean sample error of 100 would result in an output sample rate of 1,000,000 Hz (samples/sec). The Scaling Factor shown in Table III is the amount of scaling required to properly integrate a new value of sample error with previous values, as shown in the code segment of Table I.

FIGS. 6(*d*) and 7(*d*) show why the sample error spans a range rather than remaining at a single value. The simulated input samples arrive at FIFO 30 of FIG. 1 in bursts of eight. The arrival of a burst, shown in FIG. 7(*a*), causes the sample error to abruptly increase. At this point, the output samples are suddenly eight samples farther behind the input samples. The small steps in sample error shown in FIG. 6(*d*) and 7(*d*) are caused by the removal and reconstruction of output samples from FIFO 30. When each output is removed from FIFO 30, the output samples are one less sample behind the input samples.

In FIG. 6(*d*), there is also a trend of increasing sample error because the output sample rate is still "catching up" to the input sample rate. At this point in the simulation, the input samples are arriving at FIFO 30 faster than they are being removed from it, and the sample error is increasing as a result. This increasing sample error further stimulates the control loop to "catch up" to the mean input sample rate.

Many physical embodiments of the present invention will be apparent to those skilled in the art. Two such embodiments will now be described with respect to FIGS. 4 and 5.

Figure 4:
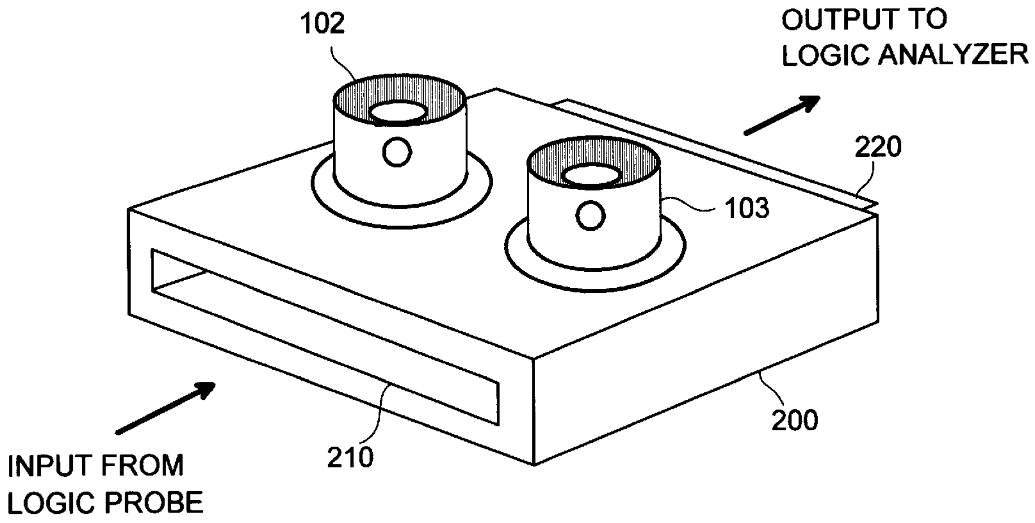
FIG. 4 is a perspective view of an embodiment of the present invention using an existing logic analyzer.

FIG. 4 shows an embodiment of the present invention using an existing logic analyzer. In this embodiment, the logic analyzer serves as DSP context detector 20, described above with respect to FIG. 1. Sample reconstruction circuit 100 of FIG. 1 is packaged into a small unit 200 which plugs into the existing logic analyzer through an output connector 220, in place of one of the logic analyzer's digital probes. The digital probe of the logic analyzer, commonly referred to as a "pod," plugs into an input connector 210 on one side of unit 200.

Digital signals from input connector 210 are sent to the FIFO buffer memory 30 of sample reconstruction circuit 100 of FIG. 1, which is packaged inside unit 200. The digital signals from input connector 210 are also sent to the existing logic analyzer through output connector 220. The trigger output of the logic analyzer is sent to trigger input 102 with a standard BNC connector on unit 200. The reconstructed analog signal is sent out of device 100 of FIG. 1 from output 103 with a second BNC connector on unit 200, from which it can be analyzed with external test equipment.

The trigger output signal from a logic analyzer will of course be delayed somewhat with respect to the occurrence that triggered it. If the DSP has a very high clock frequency, the trigger signal could possibly reach trigger input 102 after the desired digital sample is no longer present at digital probe 101. However, several ways of keeping the desired sample at digital probe 101 until the trigger signal reaches trigger input 102 will be readily apparent to those of skill in the art. One option would be to simply extend the length of time the sample remains at digital probe 101. If the probe is coupled to a data bus of the DSP, this can be done by adding wait states to the DSPs access of the bus. A digital delay or FIFO buffer memory may also be placed between digital probe 101 and FIFO 30 of FIG. 1 to delay and thus synchronize the digital values from the DSP with trigger input 102.

Figure 5:
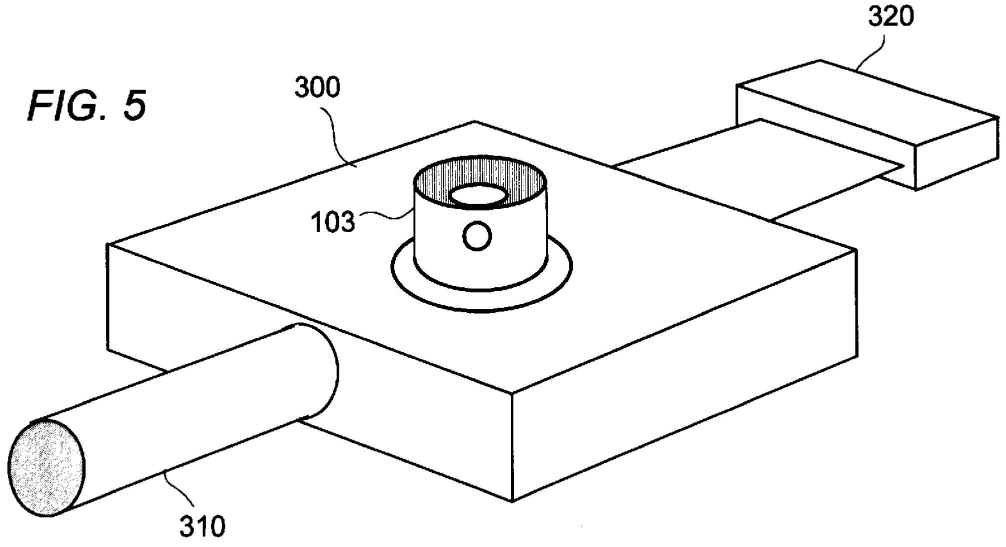
FIG. 5 is a perspective view of an embodiment of the present invention using an existing DSP emulator system.
Figure 6A:
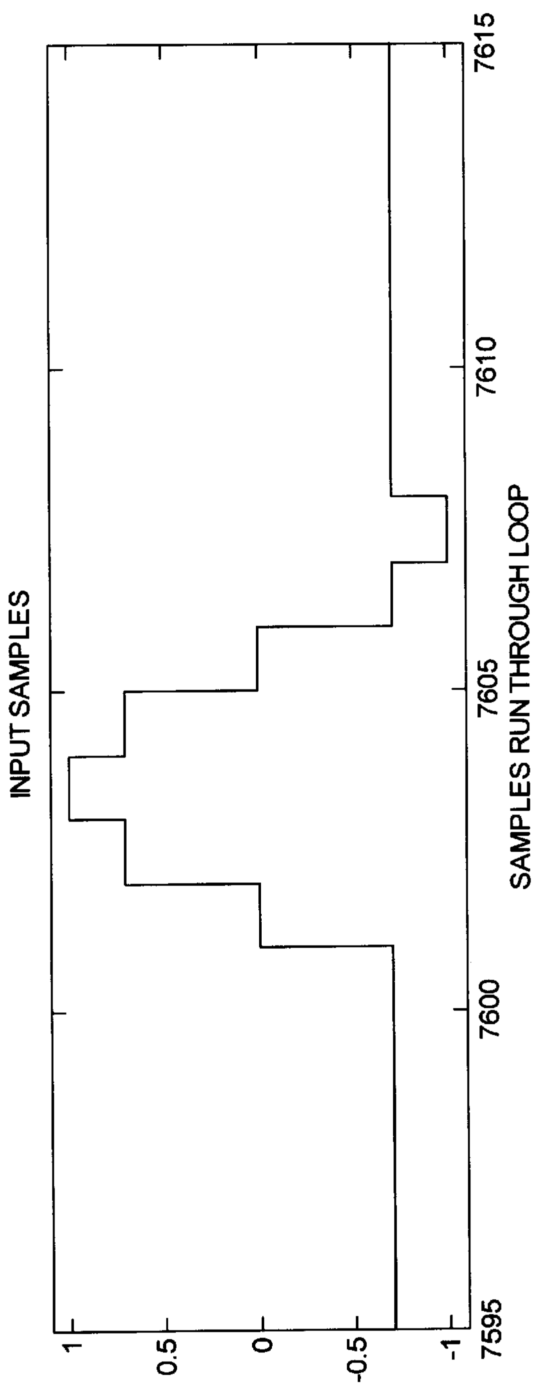
FIG. 6, comprising FIGS. 6(*a*)–6(*d*), is a simulation plot that illustrates the start-up operation of a control loop in an embodiment of the present invention.
Figure 6B:
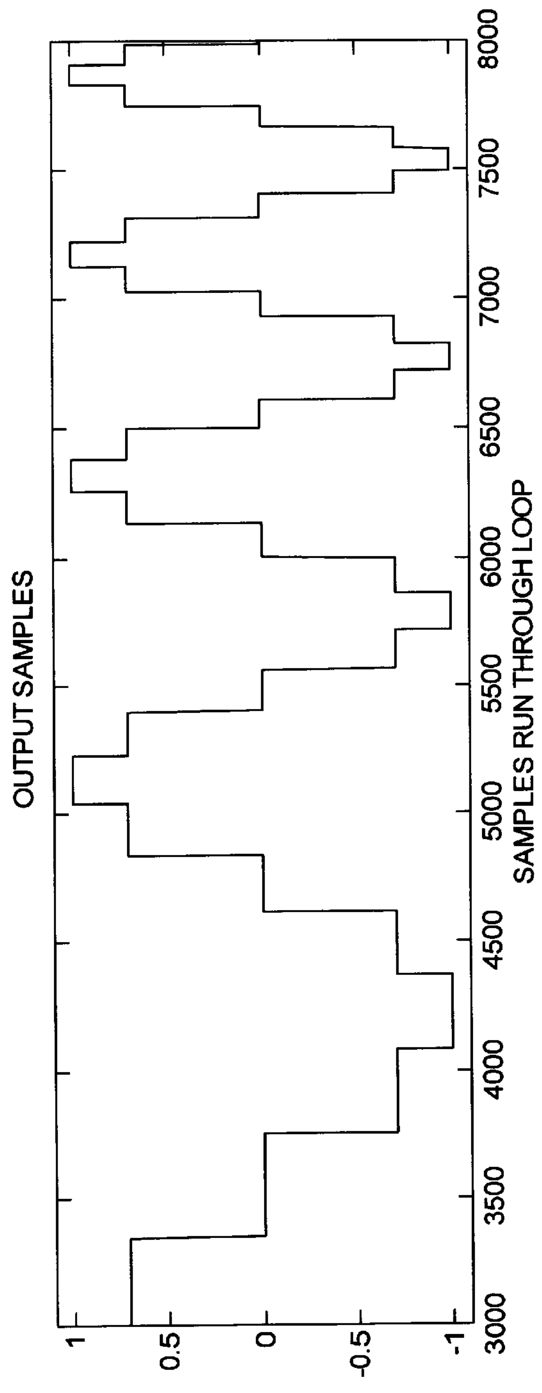
Figure 6C:
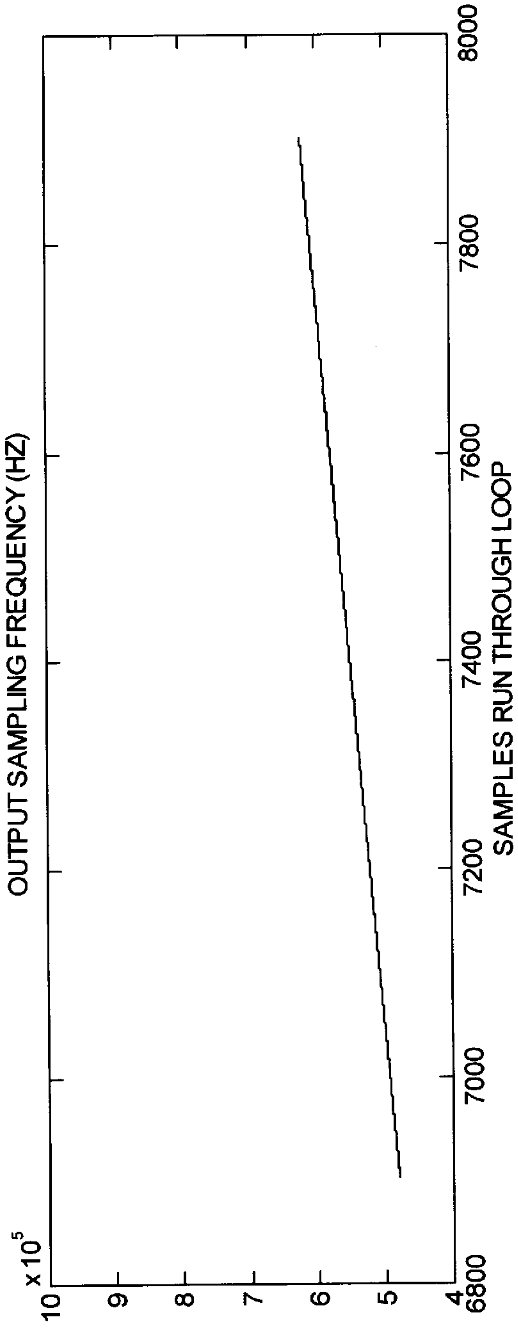
Figure 6D:
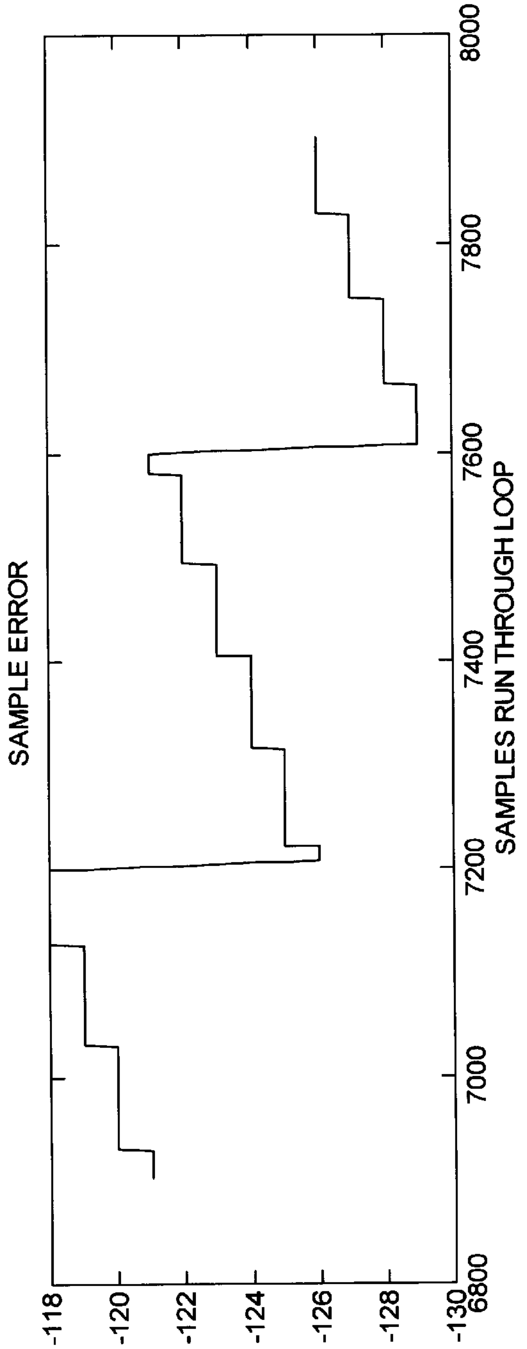
Figure 7A:
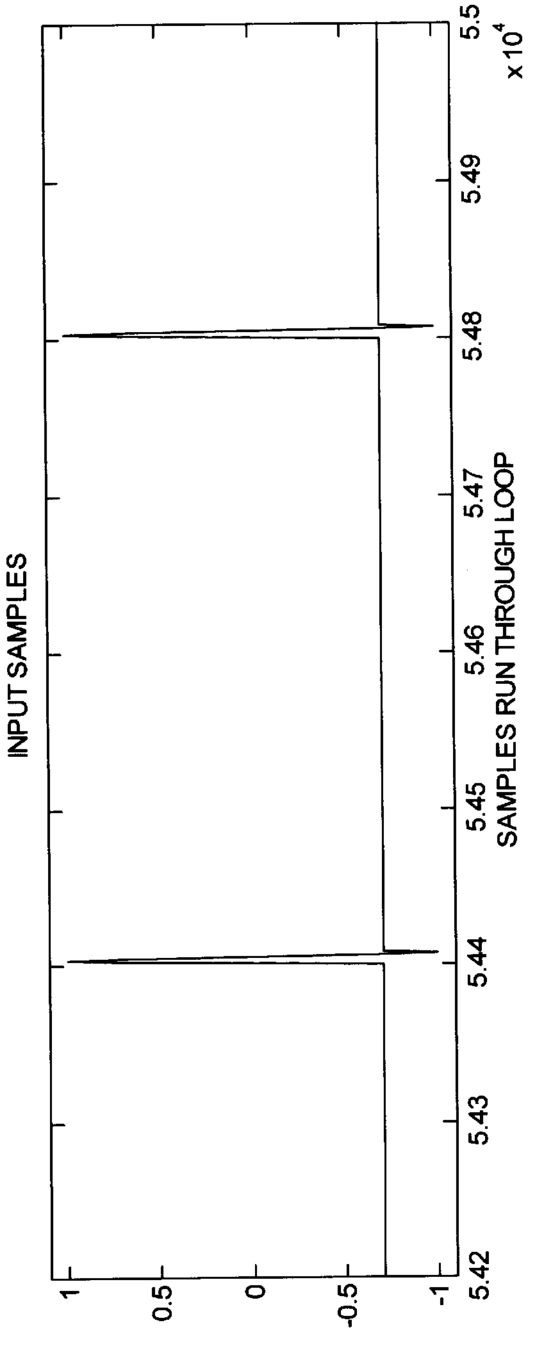
FIG. 7, comprising FIGS. 7(*a*)–7(*d*), is a simulation plot that illustrates the steady-state operation of a control loop in an embodiment of the present invention.
Figure 7B:
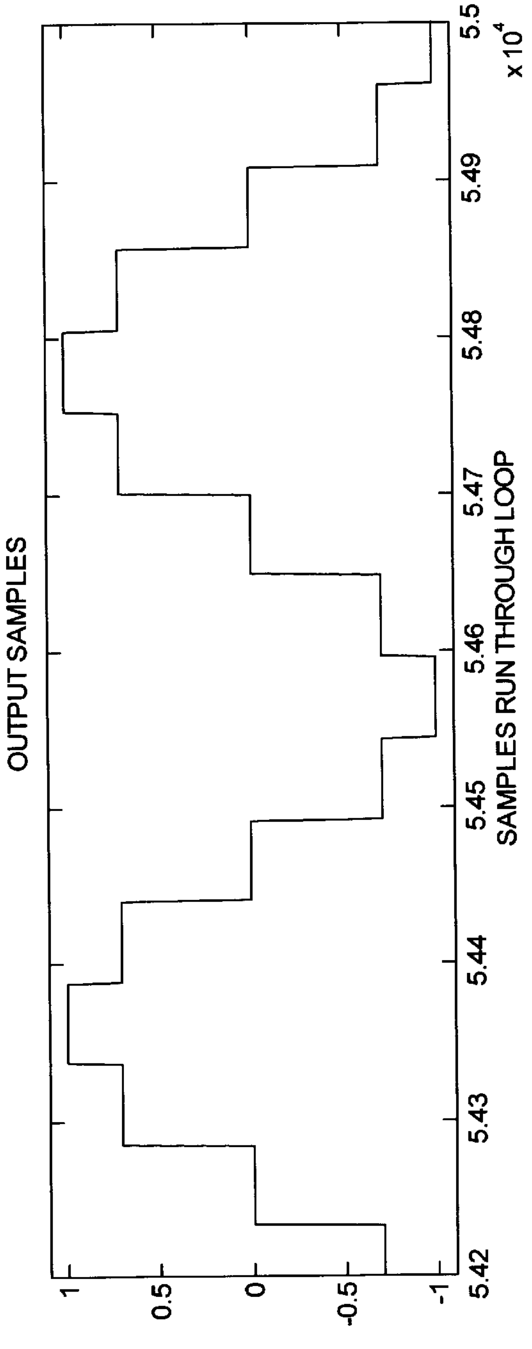
Figure 7C:
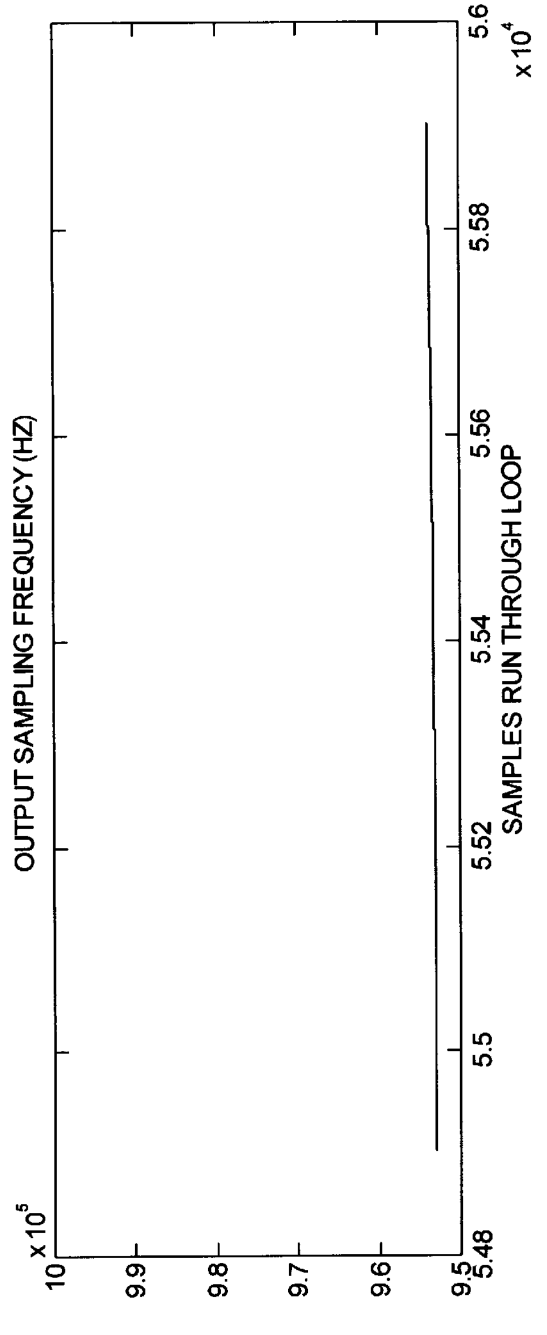
Figure 7D:
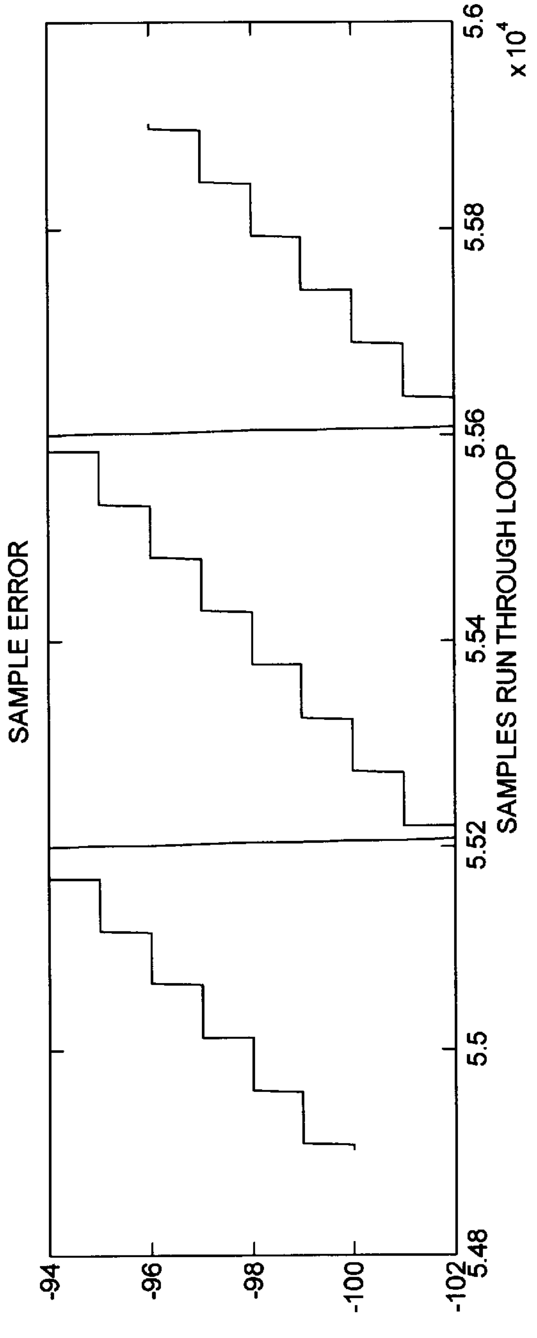

Although the foregoing description of FIG. 4 relates to an external accessory for a logic analyzer, the invention may also be embodied within a logic analyzer as an additional feature. In this case, the logic analyzer would have an additional output connector for transmitting a reconstructed analog signal to external test equipment FIG. 5 shows an embodiment of the present invention using an existing DSP emulator system. In this embodiment, the existing DSP emulator system serves as DSP context detector 20, described above with respect to FIG. 1. The sample reconstruction circuit 100 of FIG. 1 is packaged into a small unit 300, which would otherwise serve only to buffer the connector 320 before it connects electrically to a long cable 310. The reconstructed analog signal is sent out of device 100 of FIG. 1 from output 103 with a BNC connector on unit 200, from which it can be analyzed with external test equipment.

Connector 320 normally plugs into an IEEE 1149.1 JTAG test access port of DSP 10 of FIG. 1. One skilled in the design of DSP emulator systems will be familiar with the IEEE 1149.1 JTAG standard for boundary scan of integrated circuits. DSP 10 of FIG. 1 communicates with an emulator system through connector 320, unit 300, and cable 310.

Context detector 20 of FIG. 1 and input 101 may both be connected to the serial data lines of the JTAG test access port. The context of the DSP's operation and the digital samples of interest may then be extracted by appropriate identification and translation of the serial data. Alternatively, the emulator system at the far end of cable 310 may produce appropriate signals for inputs 101 and 102 of FIG. 1, and transmit these signals back to unit 300 through cable 310. As yet another alternative, the entire sample reconstructing apparatus 100 of FIG. 1 may be contained in the emulator system at the far end of cable 310. In this case, only the reconstructed analog output signal would return to unit 300 through cable 310 to be sent out of the device from output 103 with a BNC connector.

FIG. 9 shows another possible embodiment of the present invention in which context detector 20 is included on the integrated circuit containing the DSP. In this embodiment, DSP 10 activates context detector 20 with a special test instruction to send a copy of a digital sample of interest outside the DSP integrated circuit. There are two main blocks in FIG. 9. The first block 110 contains all the circuitry on the DSP integrated circuit. The second block 120 is a sample reconstruction device that houses the sample reconstruction circuit and connects to the DSP integrated circuit 110 through a serial bus 104. A physical embodiment of sample reconstruction device 120 will be discussed in greater detail with respect to FIG. 10.

When the DSP has generated a digital sample of interest, in this embodiment, it executes a special test instruction. This instruction causes context detector 20 to assert a first trigger signal T1. This causes the digital sample to be loaded into a parallel-to-serial converter 91. Converter 91 then converts the digital sample from the parallel form of the DSP data bus into serial data. It then sends the serially encoded digital sample from the DSP integrated circuit to sample reconstruction device 120 using serial bus 104. A signal conditioning circuit 93 may be used at the input of device 120 to compensate for distortion or signal loss on serial bus 104.

There are several suitable schemes for encoding the data onto serial bus 104. The beginning and end of a data word may be indicated with a dedicated framing signal. A dedicated clock signal may also be used. For a test environment, however, it is best to use as few connections as possible for serial bus 104. Accordingly, it may be desirable to send serial data asynchronously on a single wire. The beginning and end of each data word is then indicated by one or more start and stop bits, and the serial clock is encoded onto the data. If digital signals with very high sample rates are to be transmitted over serial bus 104, separate clock and framing signals may be desirable despite the fact that additional wires are needed. Those of skill in the communications art will readily understand each of the possible serial encoding schemes, and will be able to easily implement the most efficient one for the desired application.

Several digital signals may be multiplexed onto serial bus 104. If two signals are to be monitored, for example, DSP 10 sends the digital samples for each signal to separate registers inside parallel-to-serial converter 91 with two separate test instructions. Context detector 20 uses a selection signal M to indicate which of the two digital signals produced the current digital sample. Converter 91 then encodes a distinct identification onto the digital sample before transmitting it on serial bus 104. This identification may simply be an extra bit or field of bits accompanying the data bits for the digital sample.

Figure 10:
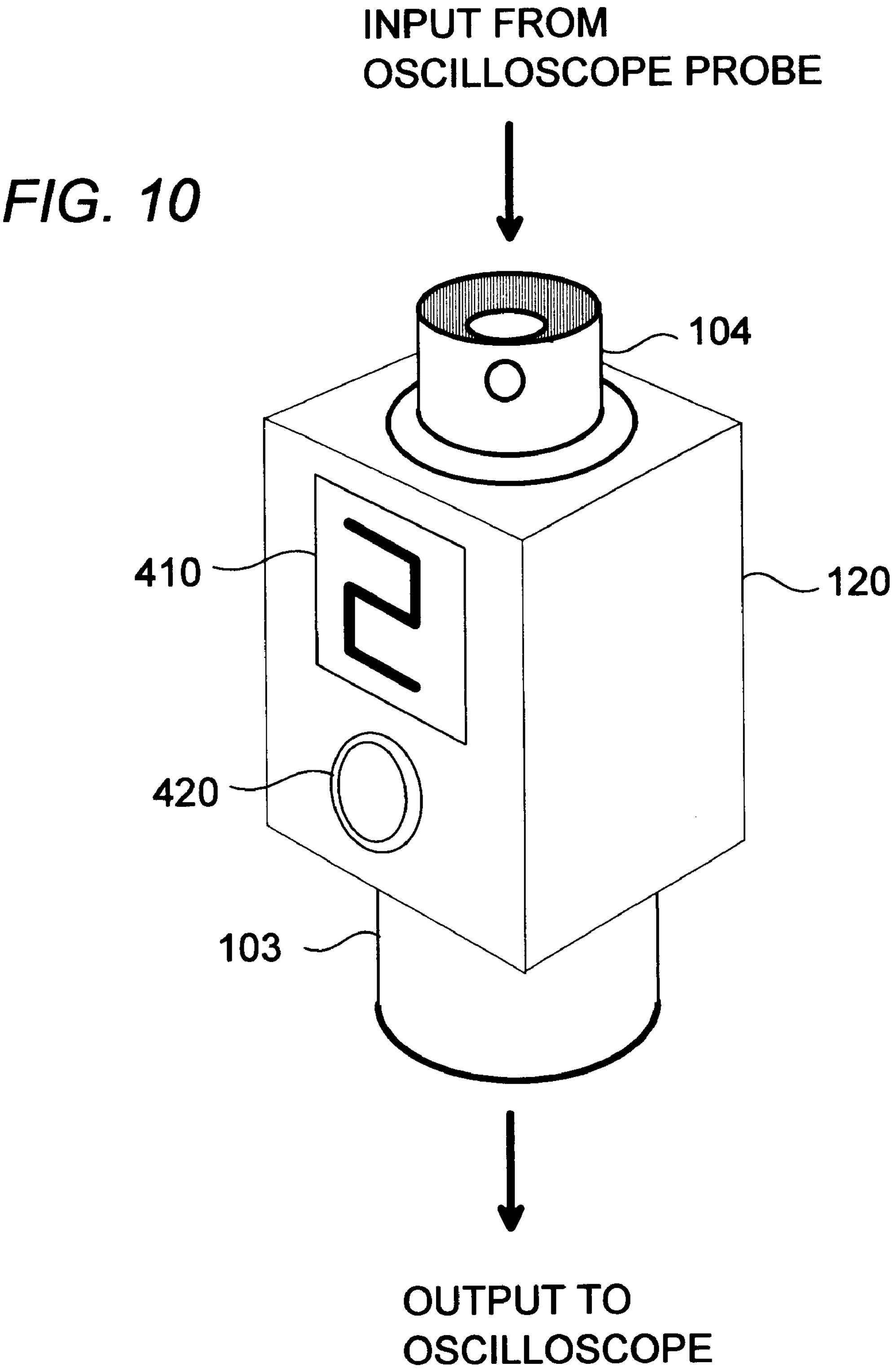
FIG. 10 is a perspective view of a sample reconstruction device that connects to a DSP integrated circuit.

The description of FIG. 1 above explained how a trigger signal T controls the writing of the new digital sample into FIFO buffer memory 30. In the embodiment of FIG. 9, this trigger signal is encoded onto the serial data signal by parallel-to-serial converter 91. FIG. 10 shows how a second trigger signal T2 is generated inside sample reconstruction device 120 in the presence of a digital sample on serial bus 104. Sample reconstruction circuit 100 then responds to the digital sample appearing on its data probe input 101 because trigger signal T2 appears on its trigger input 102. At this point, sample reconstruction circuit 100 functions as described above with respect to FIG. 1.

In the case of a single non-multiplexed signal, the presence of any digital sample on serial bus 104 produces trigger signal T2. If more than one signal is expected on serial bus 104, sample reconstruction device 120 may be programmed to respond only to digital samples produced by a single one of several multiplexed signals. Signal detector 92 then generates the second trigger signal T2 only when such a digital sample is identified.

If serial bus 104 is comprised of a single wire, the connection from DSP integrated circuit 110 to sample reconstruction device 120 may be made with an oscilloscope probe. A simple test point may be provided on the print circuit board upon which DSP integrated circuit 110 is mounted. If multiplexed signals are present on serial bus 104, several reconstruction devices can be connected to this single test point and programmed to respond to digital samples produced by different signals. A physical embodiment of sample reconstruction device 120 especially suited for use with an oscilloscope probe is pictured in FIG. 10.

The embodiment of FIG. 9 may be implemented with a conventional DSP using one of its existing synchronous serial ports. In a 21xx family DSP, for example, data may be written to one of the available serial ports with a special instruction having the form TX0={Register}. TX0 is a register dedicated to one of the serial ports and {Register} is the name of a register selected from all the registers in the DSP. When this instruction is executed, the data contained in the selected register is placed on the DSP's internal data bus. Circuitry on the DSP performs the function of context detector 20 by causing this data to be written into parallel-to-serial converter 91, which in this embodiment is the DSP serial port circuitry.

The serial data is transmitted from DSP 110 over serial bus 104, which in this case is a three-wire synchronous serial bus having dedicated framing and clock signals. Sample reconstruction device 120 may be implemented using a conventional DSP of the same type as DSP 110. This second DSP has its own synchronous serial ports that are compatible for receiving the signals present on serial bus 104. Many of the functions of sample reconstruction circuit 100 may of course be implemented using the second DSP.

FIG. 10 shows a physical embodiment of sample reconstruction device 120 designed to use a standard oscilloscope probe for the connection to DSP 110. The oscilloscope probe connects to an input for serial bus 104 using a standard BNC female connector. Analog output signal 103 is transmitted to an oscilloscope or other analog test equipment through a standard BNC male connector. A selection button 420 allows the user to select a single one of the several multiplexed signals that may be present on serial bus 104. Only samples produced by this selected signal will be reconstructed into an analog signal on output 103. The selected signal is identified with an LED or LCD indicator 410. FIG. 10 pictures only one of many possible physical embodiments of sample reconstruction device 120.

While the present invention has been described in terms of preferred embodiments and generally associated methods, it is contemplated that alterations and permutations thereof will become apparent to those skilled in the art upon a reading of the specification and study of the drawings. The present invention is not intended to be defined by the above description of preferred exemplary embodiments. Rather, the present invention is defined variously by the appended claims. Each variation of the present invention is intended to be limited only by the recited limitations of its respective claim, and equivalents thereof, without limitation by terms not present therein.

TABLE I

```
{ This is the start of the control loop code.                    }
{ Update error term: Input sample - output sample                }
    { Put error E in samples (16.0) in register mr0              }
    mr0 = dm(error);
{ Scale error term to +/- 1 fixed point with block               }
{ floating point. Exponent will be from about -4 to -11,         }
{ based on sample error range of 10-1000 for operating           }
{ sample rate range of 1-100 kHz                                 }
{ Get largest permissible common exponent                        }
sb = -13;              { Set to largest permissible              }
sb = expadj mr0;          { exponent of new input                }
{ Get exponent of unscaled delay line sample                     }
    si = dm(oldsample); se = dm(oldexp);
    { Un-scale old sample while saving lsbs in si                }
    sr = ashift si (hi); si = sr0;
    sb = expadj sr1;          { exponent of old sample           }
    se = sb;              { Get ready for normalization          }
{ Save this exponent for un-scaling of next                      }
{ sample's delay buffer                                          }
dm(oldexp) = sb;
{ Re-scale delayed sample(s) by new largest                      }
{ exponent - retain lsb's from si                                }
sr = norm sr1 (hi); sr = sr or norm si (lo);
mx1 = sr1;        { Put into x[1] in filter                      }
{ Scale current sample by largest exponent                       }
sr = norm mr0 (hi);
mx0 = sr1;        { Put into x[0] in filter                      }
{ 1st order Butterworth IIR filter                               }
my0 = lf_b;
mr = mx0 * my0 (ss);
my1 = lf_a1;
mr = mr - mx1 * myl (rnd);
if mv sat mr;
cm(oldsample) = mr1;
```

TABLE II

```
{ Transform loop filter output to get output sample rate             }
    { Divide DSP clock frequency by sample rate to get               }
    { timer period                                                   }
    { Timer_per = fclk/fs, fs = (A/As) * filtered(As*err)            }
    { Timer_per = ( fclk/A * As)/filtered(As*err)                    }
    { (fclk/(A*As))/abs(filter(err))                                 }
    { -- done ----    ---- done ----                                 }
    { [sr1 sr0]       [ar]                                           }
    ar = abs mr1; ay1 = sr1; ay0 = sr0;
    divs ayl, ar;
    divq ar; divq ar; divq ar;      { 1-3                            }
    divq ar; divq ar; divq ar;      { 4-6                            }
    divq ar; divq ar; divq ar;      { 7-9                            }
    divq ar; divq ar; divq ar;      { 10-12                          }
    divq ar; divq ar; divq ar;      { 13-15                          }
    { Re-scale by inverse of exponent to get back to float           }
    { Normally, this would be done with the 'norm' command           }
    { but we are doing the scaling of the denominator in             }
    { the numerator, so we are shifting the other way.               }
    { Register se is still valid from normalization.                 }
    mr0 = fclk_over_A_hi;      si = fclk_over_A_lo;
    sr = norm mr0 (hi);        sr = sr or norm si (lo);
    { Saturate counter period and shut off output flag               }
    { if result of division overflows 16 bits                        }
    { Overflow if (19 + (-SEin)) - (14 + SEout) > 16                 }
    { SEin + SEout < -11                                             }
    a x 0 = se;        { Get SEin                                    }
    se = exp mr1 (hi);        { Get SEout, +/- have same exp         }
    ay1 = se; ar = ax0 + ay1; { SEin + SEout                         }
    ay1 = 11; ar = ar + ay1;            { <- 11 ?                    }
    ax1;            { Enable output if no overflow                   }
    if ge jump divide_ok;
    ay0 = 0 x 7fff;      {  Saturate timer period                    }
    ax0 = 0;        { Disable output                                 }
```

TABLE II-continued

```
divide_ok:
dm(out_flag) = ax0;
{ Adjust timer period }
dm(TPERIOD) = ay0;
{ This is the end of the control loop code.          }
```

TABLE III

Simulation: fs1 = 1000000 KSPS, fc = 0.0001, A = −10000
Each row reports on last 1000 samples through loop.

| Count | fs2: mean & std. dev. | | Sample Error Range (−) | Scaling Factor |
|---|---|---|---|---|
| 1000 | 1289 | 1263 | −23 to 0 | 32 |
| 2000 | 13152 | 6135 | −39 to −23 | 64 |
| 3000 | 46189 | 13207 | −62 to −39 | 64 |
| 4000 | 105206 | 20949 | −76 to −61 | 128 |
| 5000 | 190525 | 28254 | −96 to −76 | 128 |
| 6000 | 299171 | 34317 | −107 to −94 | 128 |
| 7000 | 425873 | 38621 | −122 to −106 | 128 |
| 8000 | 563997 | 40884 | −129 to −118 | 128 |
| 9000 | 706270 | 41016 | −137 to −125 | 256 |
| 10000 | 845456 | 39129 | −140 to −131 | 256 |
| 11000 | 974948 | 35460 | −141 to −133 | 256 |
| 12000 | 1089153 | 30354 | −141 to −131 | 256 |
| 13000 | 1183733 | 24194 | −139 to −128 | 256 |
| 14000 | 1255808 | 17420 | −134 to −122 | 128 |
| 15000 | 1303952 | 10455 | −129 to −117 | 128 |
| 16000 | 1328214 | 3744 | −122 to −108 | 128 |
| 17000 | 1329904 | 2683 | −116 to −103 | 128 |
| 18000 | 1311452 | 7984 | −107 to −95 | 128 |
| 19000 | 1276151 | 12286 | −102 to −90 | 128 |
| 20000 | 1227963 | 15399 | −95 to −84 | 128 |
| 21000 | 1171121 | 17272 | −92 to −81 | 128 |
| 22000 | 1109901 | 17936 | −87 to −78 | 128 |
| 23000 | 1048328 | 17489 | −86 to −77 | 128 |
| 24000 | 990026 | 16075 | −84 to −76 | 128 |
| 25000 | 938013 | 13884 | −85 to −77 | 128 |
| 26000 | 894614 | 11135 | −87 to −78 | 128 |
| 27000 | 861393 | 8039 | −90 to −81 | 128 |
| 28000 | 839177 | 4821 | −92 to −83 | 128 |
| 29000 | 828036 | 1698 | −96 to −86 | 128 |
| 30000 | 827427 | 1304 | −99 to −89 | 128 |
| 31000 | 836236 | 3789 | −102 to −93 | 128 |
| 32000 | 852957 | 5813 | −105 to −96 | 128 |
| 33000 | 875749 | 7283 | −108 to −99 | 128 |
| 34000 | 902641 | 8173 | −109 to −101 | 128 |
| 35000 | 931626 | 8498 | −111 to −103 | 128 |
| 36000 | 960821 | 8299 | −111 to −103 | 128 |
| 37000 | 988514 | 7646 | −112 to −104 | 128 |
| 38000 | 1013288 | 6623 | −112 to −103 | 128 |
| 39000 | 1034020 | 5330 | −111 to −103 | 128 |
| 40000 | 1049967 | 3872 | −110 to −101 | 128 |
| 41000 | 1060716 | 2354 | −109 to −100 | 128 |
| 42000 | 1066269 | 886 | −107 to −98 | 128 |
| 43000 | 1066813 | 564 | −106 to −97 | 128 |
| 44000 | 1062748 | 1792 | −104 to −95 | 128 |
| 45000 | 1054784 | 2774 | −103 to −94 | 128 |
| 46000 | 1043904 | 3479 | −101 to −93 | 128 |
| 47000 | 1031046 | 3907 | −100 to −92 | 128 |
| 48000 | 1017203 | 4058 | −99 to −91 | 128 |
| 49000 | 1003276 | 3954 | −99 to −91 | 128 |
| 50000 | 990087 | 3638 | −99 to −91 | 128 |

I claim:

1. An apparatus for reconstructing digital samples representing a signal of interest from a DSP, comprising:

a) a context detector coupled to the DSP and responsive to the context of the DSP's operation so as to provide indicia that a digital value processed by the DSP is a sample of a signal of interest;

b) a buffer memory coupled to the DSP and responsive to the indicia so as to store the sample of the signal of interest;

c) a control loop responsive to the indicia and including an output so as to provide a clock signal having a substantially constant interval determined by the mean interval between samples of the signal of interest; and d) a D/A converter responsive to the clock signal and coupled to the buffer memory so as to retrieve stored samples from the buffer memory and reconstruct the retrieved samples into an analog signal.

2. The apparatus of claim 1 wherein the buffer memory is coupled to the DSP through a dedicated test port.

3. The apparatus of claim 1 wherein the context detector comprises circuitry that is included on an integrated circuit containing the DSP.

4. The apparatus of claim 1 further comprising a parallel-to-serial converter having a write enable input coupled to the context detector, a data input responsive to the present digital value, and a serial output coupled to the data input of the buffer memory, so as to convert the present digital value into a serial data word at the serial output upon assertion of the indicia.

5. The apparatus of claim 1 wherein the DSP is configured to perform the function of the context detector by asserting at least one I/O pin upon causing a sample of a signal of interest to appear as the present digital value.

6. The apparatus of claim 1 wherein the context detector is responsive to instructions performed by the DSP and is configured to generate the indicia when the DSP has executed an instruction that causes a digital sample of the signal of interest to appear as the present digital value.

7. The apparatus of claim 1 wherein the context detector is coupled to at least an address bus of the DSP and is configured to generate the indicia when the DSP causes a memory location to be accessed having an address within a selected address range.

8. The apparatus of claim 7 wherein the context detector is further configured to generate the indicia when the DSP causes a selected state to appear on a read/write strobe.

9. The apparatus of claim 1 wherein the control loop comprises:

a) a sample lag detector for producing an error signal proportional to the number of digital values stored in the buffer memory;

b) a lowpass filter having a low cutoff frequency for filtering the error signal to preserve a mean value of the error signal while significantly attenuating variance in the error signal; and c) a clock generator for generating an output sample clock having a frequency proportional to the filtered error signal.

10. The apparatus of claim 9 wherein the cutoff frequency of the lowpass filter is less than or equal to about 0.0001 times the maximum frequency of the output sample clock.

11. A method of reconstructing digital samples representing a signal of interest from a DSP, comprising the steps of:

a) monitoring a present digital value being processed by the DSP;

b) asserting a trigger signal when a present context of the DSP's operation indicates that the present digital value is a sample of a signal of interest;

c) storing the present digital value into a buffer memory upon assertion of the trigger signal;

d) retrieving stored digital values from the buffer memory at a substantially constant interval determined by the mean interval between assertions of the trigger signal; and e) reconstructing the retrieved digital values into an analog signal.

12. The method of claim 11 wherein the present digital value is transmitted to the buffer memory through a dedicated test port.

13. The method of claim 11 wherein the present digital value is converted from parallel form to serial form for transmission to the buffer memory upon assertion of the trigger signal.

14. The method of claim 11 wherein the trigger signal is generated directly by the DSP.

15. The method of claim 11 wherein the trigger signal is generated when the DSP executes an instruction that causes a sample of a signal of interest to appear as the present digital value.

16. The method of claim 11 wherein the trigger signal is generated when the DSP causes a memory location to be accessed having an address within a selected address range.

17. The method of claim 16 wherein the trigger signal is generated only when the memory location is accessed by a selected one of a read memory access and a write memory access.

18. The method of claim 11 wherein said step d) includes the steps of:

i. producing an error signal proportional to the number of digital values stored in the buffer memory, ii. lowpass filtering the error signal using a low cutoff frequency to preserve a mean value of the error signal while significantly attenuating variance in the error signal, iii. generating an output sample clock having a frequency proportional to the filtered error signal, and iv. retrieving stored digital values from the buffer memory upon assertion of the output sample clock.

19. The method of claim 17 wherein the cutoff frequency of the lowpass filter is less than or equal to about 0.0001 times the maximum frequency of the output sample clock.

20. An apparatus for extracting digital values from a DSP that are digital samples of a signal of interest and reconstructing the digital samples into an equivalent analog signal, comprising:

a) a context detector coupled to the DSP so as to monitor the context of the DSP's operation and generate a trigger signal when the context indicates that a present digital value being processed by the DSP is a digital sample of the signal of interest; and b) a sample reconstruction portion including i. a control loop coupled to the context detector so as to generate an output sample clock comprising pulses separated by substantially constant intervals that are determined by the mean interval between assertions of the trigger signal, ii. a buffer memory having a first clock input responsive to the trigger signal, a data input responsive to the present digital value to retrieve digital samples upon assertion of the trigger signal, a second clock input responsive to the output sample clock, and an output port to provide stored digital samples responsive to the output sample clock, and iii. a D/A converter having a clock input responsive to the output sample clock, a data input coupled to the output of the buffer memory to retrieve stored digital samples, responsive to the output sample clock, and an output to provide an analog signal represented by the stored digital samples;

whereby the digital values from the DSP that are samples of the signal of interest are reconstructed into a series of uniformly spaced analog samples which accurately reproduce the equivalent analog signal.

21. The apparatus of claim 1 wherein the sample reconstruction portion is coupled to the DSP through a dedicated test port.

22. The apparatus of claim 1 wherein the context detector comprises circuitry that is included on an integrated circuit containing the DSP.

23. The apparatus of claim 1 further comprising a parallel-to-serial converter having a write enable input responsive to the trigger signal, a data input responsive to the present digital value, and a serial output coupled to the data input of the buffer memory, for converting the present digital value into a serial data word at the serial output upon assertion of the trigger signal.

24. The apparatus of claim 1 wherein the DSP is configured to perform the function of the context detector by asserting at least one I/O pin upon causing a digital of a sample of a signal of interest to appear as the present digital value.

25. The apparatus of claim 1 wherein the context detector is responsive to instructions performed by the DSP and is configured to generate the trigger signal when the DSP has executed an instruction that causes a digital sample of the signal of interest to appear as the present digital value.

26. The apparatus of claim 1 wherein the context detector is coupled to at least an address bus of the DSP and is configured to generate the trigger signal when the DSP causes a memory location to be accessed having an address within a selected address range.

27. The apparatus of claim 26 wherein the context detector is further configured to generate the trigger signal when the DSP causes a selected state to appear on a read/write strobe.

28. The apparatus of claim 1 wherein the control loop comprises:

a) a sample lag detector for producing an error signal proportional to the number of digital values stored in the buffer memory;

b) a lowpass filter having a low cutoff frequency for filtering the error signal to preserve a mean value of the error signal while significantly attenuating variance in the error signal; and c) a clock generator for generating an output sample clock having a frequency proportional to the filtered error signal.

29. The apparatus of claim 28 wherein the cutoff frequency of the lowpass filter is less than or equal to about 0.0001 times the maximum frequency of the output sample clock.

* * * * *